(12) United States Patent
Park

(10) Patent No.: US 7,238,573 B2
(45) Date of Patent: Jul. 3, 2007

(54) METHOD FOR FABRICATING A TRENCH TRANSISTOR OF SEMICONDUCTOR DEVICE

(75) Inventor: Jeong Ho Park, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/748,241

(22) Filed: Dec. 31, 2003

(65) Prior Publication Data
US 2005/0090068 A1  Apr. 28, 2005

(30) Foreign Application Priority Data
Oct. 28, 2003 (KR) ............. 10-2003-0075431
Oct. 28, 2003 (KR) ............. 10-2003-0075440
Nov. 7, 2003 (KR) ............. 10-2003-0078770

(51) Int. Cl.
*H01L 21/336* (2006.01)
(52) U.S. Cl. ............. 438/259; 438/301; 257/E21.655
(58) Field of Classification Search ............. 438/242, 438/243, 259, 361, 430, 524, 301; 257/E21.655
See application file for complete search history.

(56) References Cited

U.S. PATENT DOCUMENTS

| 5,072,266 A | 12/1991 | Bulucea et al. |
| 5,198,694 A | 3/1993 | Kwasnick et al. |
| 5,429,970 A * | 7/1995 | Hong ............. 438/259 |
| 5,541,425 A | 7/1996 | Nishihara |
| 5,604,138 A | 2/1997 | Lee et al. |
| 5,780,340 A * | 7/1998 | Gardner et al. ............. 438/259 |
| 5,866,931 A | 2/1999 | Bulucea et al. |
| 5,907,776 A | 5/1999 | Hshieh et al. |
| 5,998,288 A * | 12/1999 | Gardner et al. ............. 438/589 |
| 6,040,212 A * | 3/2000 | Kim ............. 438/242 |
| 6,171,916 B1 * | 1/2001 | Sugawara et al. ............. 438/303 |
| 6,171,959 B1 | 1/2001 | Nagabushnam |
| 6,218,221 B1 | 4/2001 | Sah |
| 6,235,580 B1 | 5/2001 | Lee et al. |

(Continued)

FOREIGN PATENT DOCUMENTS
KR  1002182600000  6/1999

OTHER PUBLICATIONS
Stanley Wolf and Richard N. Tauber, Silicon Processing For The VLSI Era, 1986, Lattice Press, vol. 1, pp. 551-555.*

*Primary Examiner*—Michael Lebentritt
*Assistant Examiner*—Stanetta Isaac
(74) *Attorney, Agent, or Firm*—Finnegan, Henderson, Farabow, Garrett, & Dunner, L.L.P.

(57) ABSTRACT

A method for fabricating a semiconductor transistor including forming a first insulating layer on a semiconductor substrate; forming an LDD region using ion implantation; patterning the first insulating layer; forming a trench in the substrate; forming a trench gate by depositing and planarizing a second insulating layer and a conductor on the substrate with the trench formed therein; forming a photoresist pattern on the substrate; forming source/drain regions by performing an ion implantation using the photoresist pattern as a mask; and removing the photoresist pattern and the first insulating layer.

Thus, a method for fabricating a semiconductor transistor according to the present invention can reduce source/drain resistances and gate resistance by forming a trench type gate and can efficiently control a short channel effect.

11 Claims, 8 Drawing Sheets

U.S. PATENT DOCUMENTS

| | | |
|---|---|---|
| 6,309,933 B1 * | 10/2001 | Li et al. .................... 438/291 |
| 6,511,886 B2 | 1/2003 | Kim et al. |
| 6,534,352 B1 * | 3/2003 | Kim .......................... 438/197 |
| 6,630,712 B2 * | 10/2003 | Yu ............................. 257/344 |
| 6,642,130 B2 * | 11/2003 | Park .......................... 438/589 |
| 6,753,228 B2 * | 6/2004 | Azam et al. ............... 438/270 |
| 6,951,785 B2 * | 10/2005 | Oh et al. ................... 438/197 |
| 2005/0233513 A1 * | 10/2005 | Kim et al. ................. 438/197 |

* cited by examiner

METHOD FOR FABRICATING A TRENCH TRANSISTOR OF SEMICONDUCTOR DEVICE

BACKGROUND OF THE INVENTION

This application is based on and claims priority under 35 U.S.C. §119 (a)-(d), based on Korean Patent Application Nos. 10-2003-0075431, filed on Oct. 28, 2003, 10-2003-0075440, filed on Oct. 28, 2003, and Korean Patent Application No. 10-2003-0078770, filed on Nov. 7, 2003, the entire contents of which are incorporated herein by reference.

FIELD OF THE INVENTION

The present invention relates to a method for fabricating a transistor of a semiconductor device and, more particularly, to a method for fabricating a transistor which can lower source/drain resistance and gate resistance without any additional process by forming a trench type gate and can efficiently control a short channel effect.

BACKGROUND OF THE RELATED ART

Nowadays, width of a transistor gets continuously finer due to miniaturization and high integration of semiconductor. As a consequence, hot carrier effect occurs inside a transistor and degrades electrical characteristics of a drain region, because the horizontal electric field is largely concentrated at the drain region when the channel length of the transistor is shorter relative to an external voltage applied. Moreover, holes move out of the channel toward a substrate, while electrons are trapped under a gate oxide layer or spacers and affect the threshold voltage.

Although the channel region are getting shorter, the power supply voltage is relatively constant for certain applications. Therefore, the electric field in the channel is getting higher, with the result that the hot carrier effect becomes more severe.

In order to overcome the hot carrier effect, most processes of fabricating transistors employ an LDD (Lightly Doped Drain) structure. The structure has a graded junction where ion implantation density in the source/drain region is low around edges of the gate electrode and high around center of the gate electrode, thereby reducing abrupt change of electric field.

However, the transistor with an LDD structure causes a short channel effect since the channel length gets continuously shorter due to the high integration of the semiconductor device. Then, dopants in the LDD region diffuse to the channel and high electric field is applied in the channel edge between drains, which causes the hot carrier effect that degrades performance of the transistor.

Further, in operation of the transistor, impurities in source and drain regions diffuse laterally and the transistor may suffer from a punch-through effect easily. So, lots of ion implantation processes are required to prevent the punch-through effect. Also, control of the threshold voltage is difficult when the channel length and the density control are not accurate.

To solve these problems, Korean Published Patent No. 2001-64434 discloses a transistor of trench-type gate electrode structure. The transistor structure has a lower part of a transistor gate electrode buried in a substrate between spacers and a groove type gate oxide layer on the laterals and the lower part of the gate electrode, thereby increasing an effective channel length. Thus, the transistor enhances electrical characteristics of a high integration semiconductor device. However, this art also causes some problems in the miniaturization of the device since the gate is still higher than the silicon substrate because only part of the gate is buried in the substrate.

U.S. Pat. No. 6,511,886, Kim et al., and Korean Patent No. 10-0218260 disclose a method of forming a uniform oxide layer on the surface of a trench for a gate by rounding corners of the trench. However, they require an additional mask process in forming the source/drain region, so the fabrication process is complicated.

A MOSFET (Metal Oxide Semiconductor Field Effect Transistor) using a trench gate has a low turn-on resistance. In such a trench MOSFET device, the channel is arranged in a vertical direction rather than a horizontal direction which is often used in a plane composition. FIG. 1 illustrates a part of cross-sectional view of a conventional trench gate MOSFET device 2. The MOSFET device 2 includes a trench 4 filled with a conductive material separated from the silicon region 8 by a thin layer of an insulating material 10. A body region 12 is formed through diffusion in an epitaxial layer 18 and a source region 14 is formed through diffusion in the body region 12. The conducting material 6 and the insulating material 10 in the trench 4 form a gate and a gate oxide layer of the trench MOSFET, respectively. Besides, the depth L measured from the source 14 to the epitaxial layer 18 constitutes the channel length of the trench MOSFET device. The epitaxial layer 18 is a part of the drain of the trench MOSFET device. When a potential difference is applied between the body 12 and the gate 6, an electric charge is induced in the body region 12 adjacent to the gate oxide layer 10. This results in formation of a channel of the trench MOSFET device.

The above structure of the transistor is called the dual diffusion MOSFET, i.e., the 'trench DMOS', due to the two diffusion steps into the body region and the epitaxial layer. Such a trench DMOS transistor is disclosed in U.S. Pat. No. 5,907,776 to Hshieh et al., U.S. Pat. No. 5,072,266 to Bulucea et al., U.S. Pat. No. 5,541,425 to Nishihara, and U.S. Pat. No. 5,866,931 to Bulucea et al. However, in the these patents, the miniaturization of the device is limited because the separation of the source/drain regions and fabrication processes are complicated.

SUMMARY OF THE INVENTION

The present invention is directed to a method for fabricating a transistor of a semiconductor device that substantially obviates one or more problems due to limitations and disadvantages of the related art.

The present invention provides a method for fabricating a transistor device which can lower source/drain resistance and gate resistance without any additional process by forming a trench type gate and can efficiently control a short channel effect.

In accordance with the present invention, there is provided a method for fabricating a semiconductor transistor that includes forming a first insulating layer on a semiconductor substrate; forming an LDD region using ion implantation; patterning the first insulating layer; forming a trench in the substrate; forming a trench gate by depositing and planarizing a second insulating layer and a conductor on the substrate with the trench formed therein; forming a photoresist pattern on the substrate; forming source/drain regions by performing an ion implantation using the photoresist pattern as a mask; and removing the photoresist pattern and the first insulating layer.

Also in accordance with the present invention, there is provided a method for fabricating a semiconductor transistor that includes forming an LDD region using an ion implantation in a substrate; forming a first insulating layer on the substrate; patterning the first insulating layer; forming a trench in the substrate; forming a trench gate by depositing and planarizing a second insulating layer and a conductor on the substrate with the trench formed therein; anisotropically etching the first insulating layer to form spacers; and forming source/drain regions by performing an ion implantation on the substrate using the spacers and the trench gate as a mask.

Still in accordance with the present invention, there is provided a method for fabricating a semiconductor transistor that includes depositing a first insulating layer on a semiconductor substrate; forming an LDD region using an ion implantation; patterning the first insulating layer; forming a trench in the substrate; forming a trench gate by depositing and planarizing a second insulating layer and a first conductor on the substrate with the trench; depositing a second conductor on the substrate with the trench gate formed thereon; patterning the second conductor and the first insulating layer; and forming source/drain regions by performing an ion implantation using the patterned second conductor as a mask.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENT

References will now be made in detail to the preferred embodiments of the present invention, examples of which are illustrated in the accompanying drawings.

FIGS. 2a through 2g illustrate a manufacturing process of a transistor according to an embodiment of the present invention.

Figure 1:
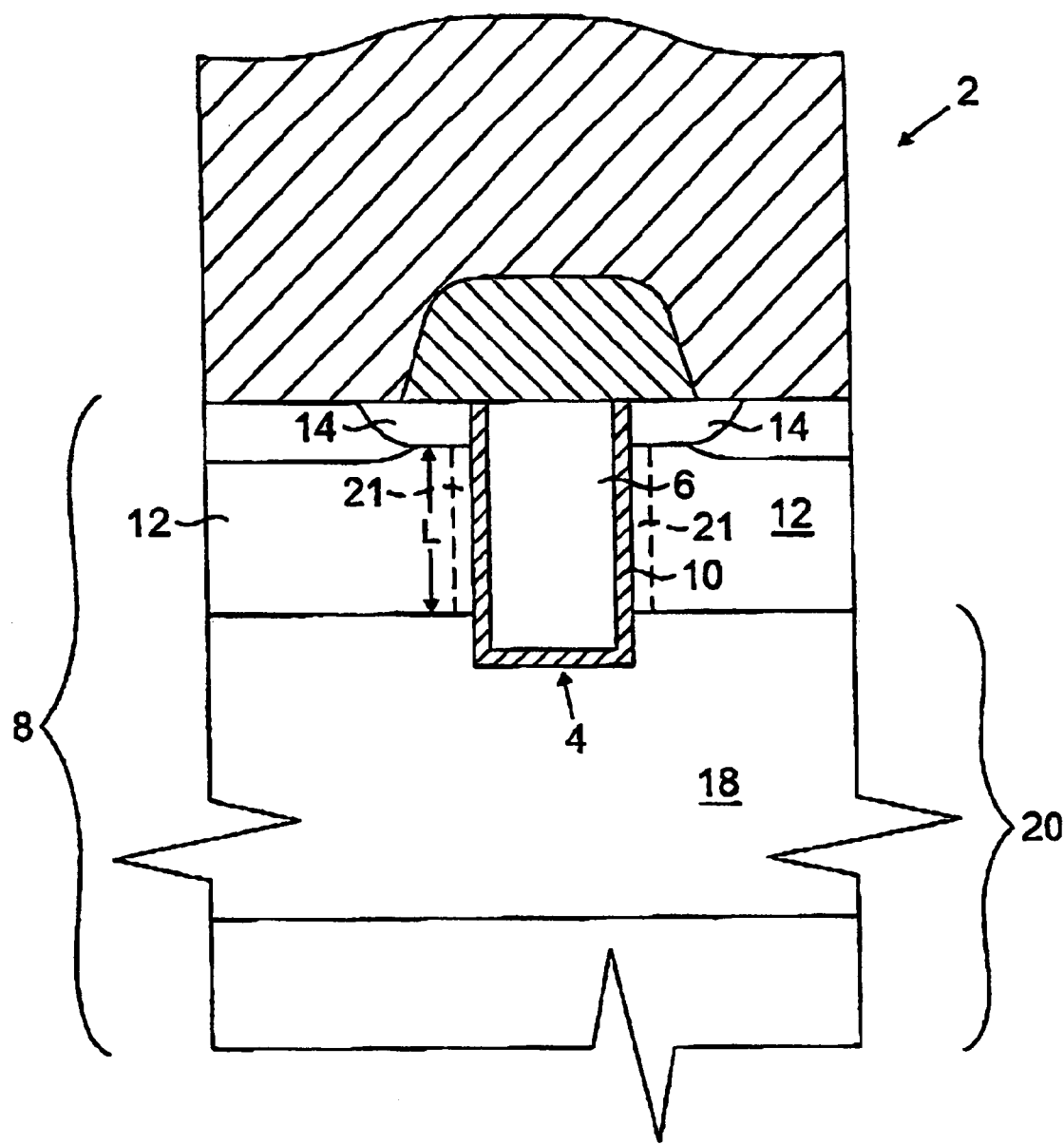
FIG. 1 illustrates a part of cross-sectional view of a conventional trench gate MOSFET device.
Figure 2A:
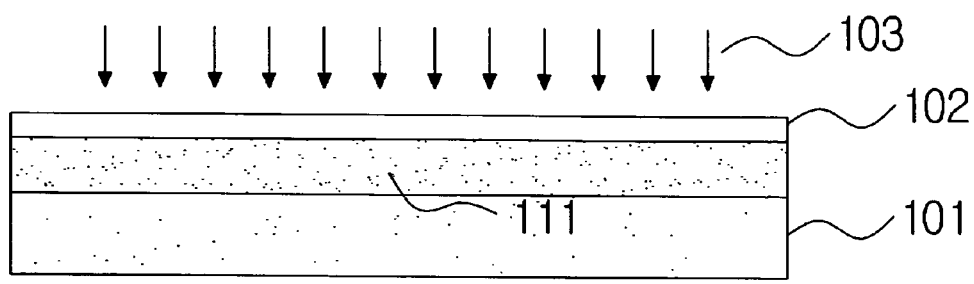
FIGS. 2a through 2g illustrate a cross-sectional view of a method for fabricating a transistor according to an embodiment of the present invention.

First, referring to FIG. 2a, a first insulating layer 102 is deposited on a silicon substrate 101 and an LDD region 111 is formed using an ion implantation 103. The first insulating layer 102 works as a buffer layer for the ion implantation and may comprise one selected from the group consisting of nitrides, tantalum oxides, titanium oxides, and hafnium oxides. In one aspect, the ion implantation energy to form the LDD region 111 is between 30 keV and 80 keV. In another aspect, the thickness of the first insulating layer 102 is between 500 Å and 1500 Å.

Figure 2B:
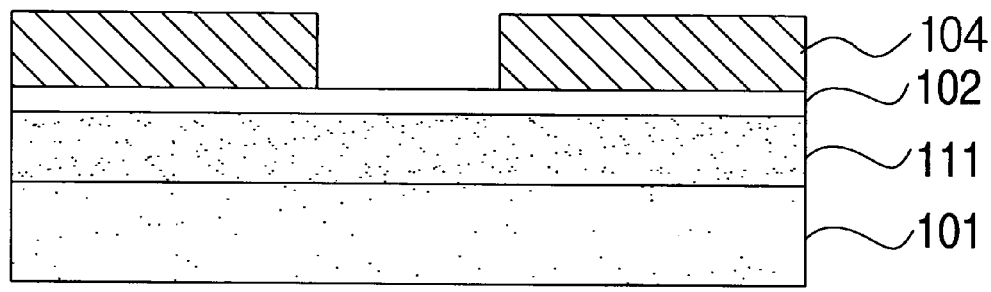

Referring to FIG. 2b, a first photoresist pattern 104 is formed on the first insulating layer 102 by first depositing a photoresist layer on the first insulating layer and then patterning the photoresist layer to expose an area for a gate with development and lithography processes.

Figure 2C:
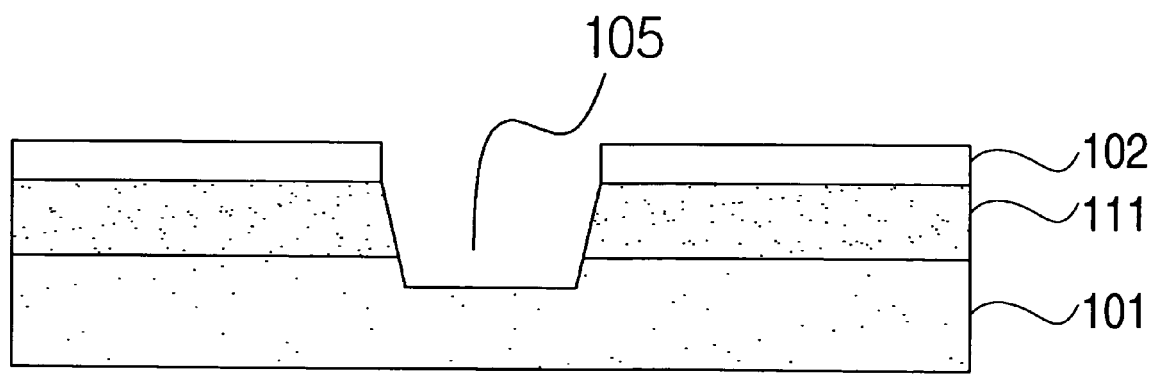

Referring to FIG. 2c, a trench 105 is formed by etching the first insulating layer and the substrate using the first photoresist pattern 104 as a mask. Then, the first photoresist pattern 104 is removed. The etching method may be dry etching with an etching angle between 5° to 30°.

Figure 2D:
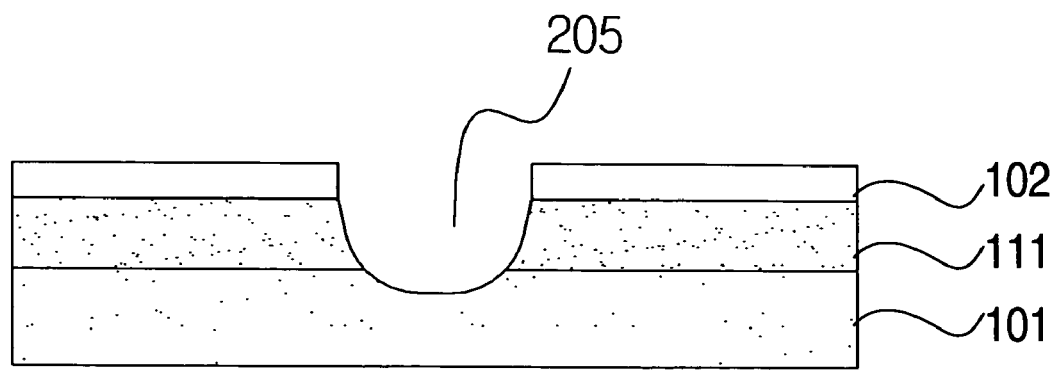

As illustrated in FIG. 2d, alternatively, an etchback using CDE (Chemical Dry Etching) may be performed to form a trench 205 with the lower edges thereof having a rounded shape. Therefore, materials may be deposited later in the trench 205 with great uniformity. In one aspect, the trench length preferably has a value between 100 Å and 1000 Å.

Figure 2E:
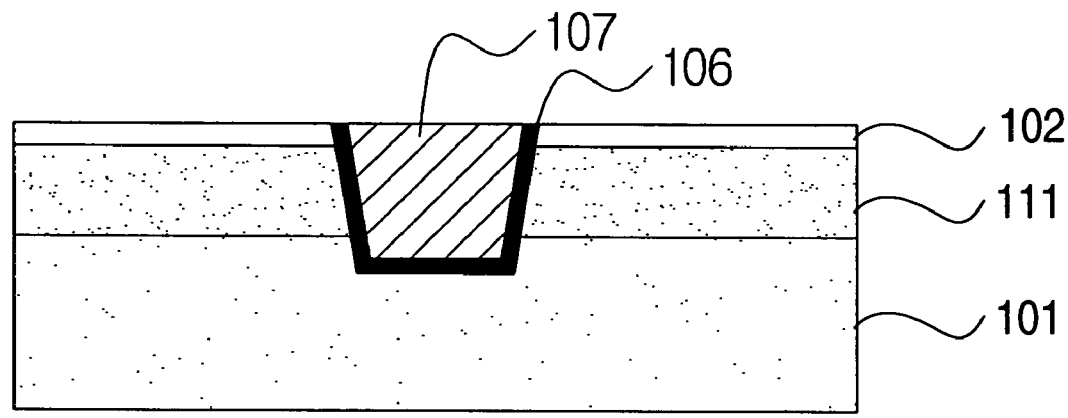

Referring to FIG. 2e, a trench gate is formed by depositing and planarizing a second insulating layer 106 and a conductor 107. In one aspect, the second insulating layer 106 may comprise an oxide layer formed on the substrate in which the trench 105 is already formed. Conductor 107 is then formed on the second insulating layer 106. Next, a trench gate (not numbered) is formed by planarizing the conductor 107 and the second insulating layer 106 using CMP (Chemical Mechanical Polishing), wherein the first insulating layer 102 is used as an etch-stop layer for the CMP process. In one aspect, the conductor 107 comprises one selected from the group consisting of tungsten alloy, titanium alloy, and tantalum alloy. The second insulating layer 106 may be formed of silicon dioxide using a conventional thermal oxide method or chemical vapor deposition. A multi-layer of oxide material can be also used as the second insulating layer 106. In addition, a gate insulating layer such as silicon nitride can be used. In one aspect, the thickness of the second insulating layer is between 15 Å and 80 Å.

Figure 2F:
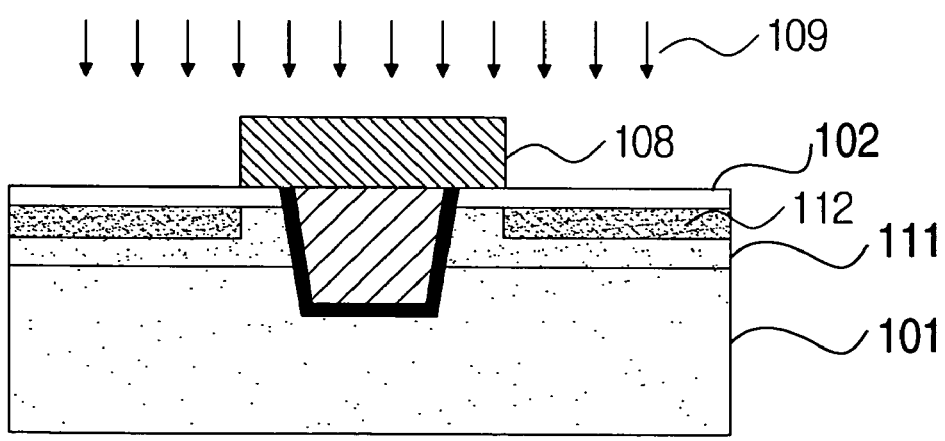

Referring to FIG. 2f, after a second photoresist pattern 108 is formed, source/drain regions 112 are formed by ion implantation 109 using the second photoresist pattern 108 as a mask. In one aspect, the ion implantation energy to form the source/drain regions is between 5 keV and 60 keV. The first insulating layer 102 is used as a buffer layer for the ion implantation to protect the substrate 101.

Figure 2G:
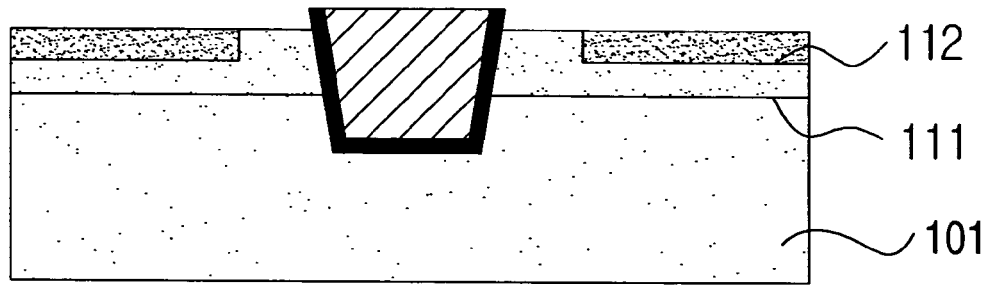

Referring to FIG. 2g, the second photoresist pattern 108 and the first insulating layer 102 are removed. The first insulating layer 102 is removed by a wet etching using, for example, a phosphoric acid solution.

The LDD region 111 and the source/drain regions 112 are formed above the gate. According to the present invention, the LDD region 111 and the source/drain regions 112 are formed by diffusion during a later thermal process, therefore the channel length of the transistor can be well controlled.

FIGS. 3a through 3g illustrate a manufacturing process of a transistor according to a second embodiment of the present invention.

Figure 3A:
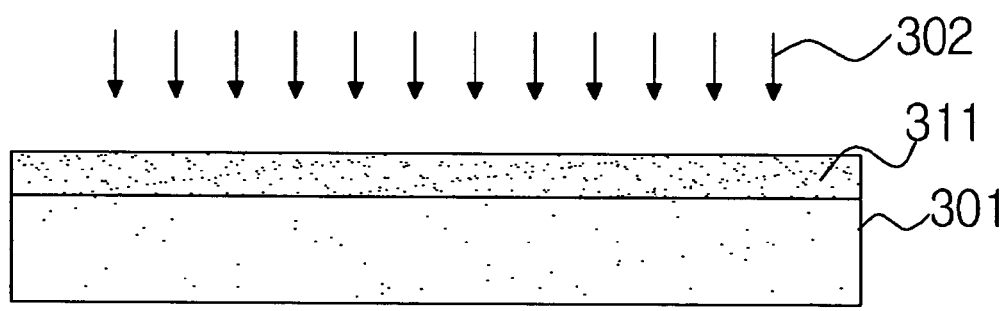
FIGS. 3a through 3g illustrate a cross-sectional view of a method for fabricating a transistor according to another embodiment of the present invention.

Referring to FIG. 3a, an LDD region 311 is formed on a silicon substrate 301 using an ion implantation 302. For a conventional transistor with a gate on a silicon substrate, a gate is formed first, and an LDD region is formed by an ion implantation process of impurities of low concentration using the gate as a mask. According to the present invention, the LDD region 311 is formed by the ion implantation process of impurities of low concentration prior to the formation of a gate. In one aspect, the ion implantation energy to form the LDD region 311 is between 10 keV and 80 keV.

Figure 3B:
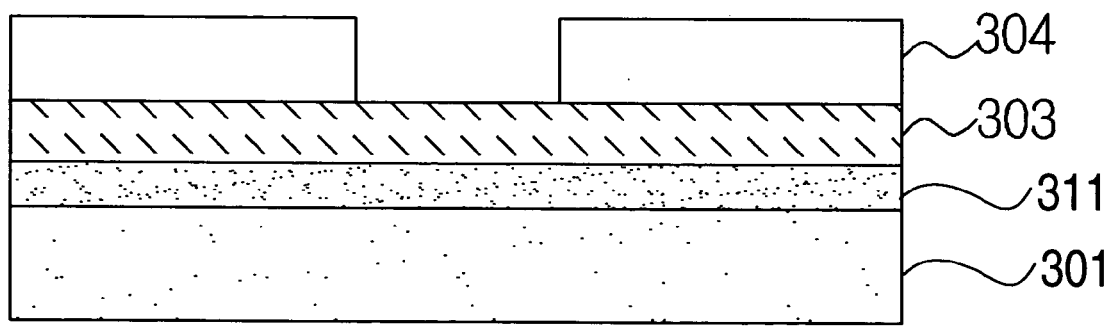

Referring to FIG. 3b, a first insulating layer 303 is formed on the substrate and a photoresist pattern 304 is formed on the first insulating layer 303. The first insulating layer 303 is deposited on the substrate on which the LDD region 311 is already formed. The photoresist pattern 304 is formed by forming a photoresist layer on the first insulating layer 303 and then patterned to expose an area for the gate with development and lithography processes. In one aspect, the first insulating layer 303 is a nitride layer or an oxide layer.

Figure 3C:
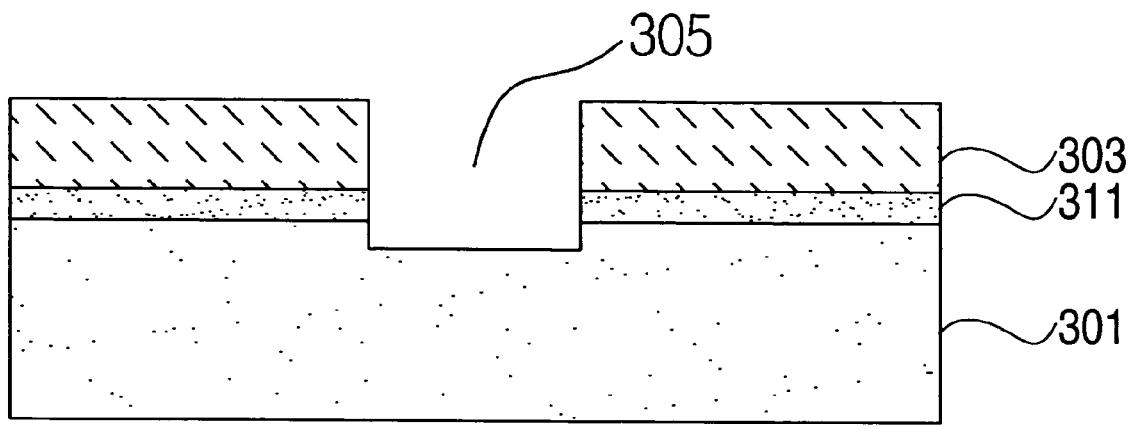

Referring to FIG. 3c, a trench 305 is formed by etching the first insulating layer and the substrate using the photoresist pattern 304 as a mask. The photoresist pattern 304 is then removed. In one aspect, the trench 305 may be formed by dry etching.

Figure 3D:
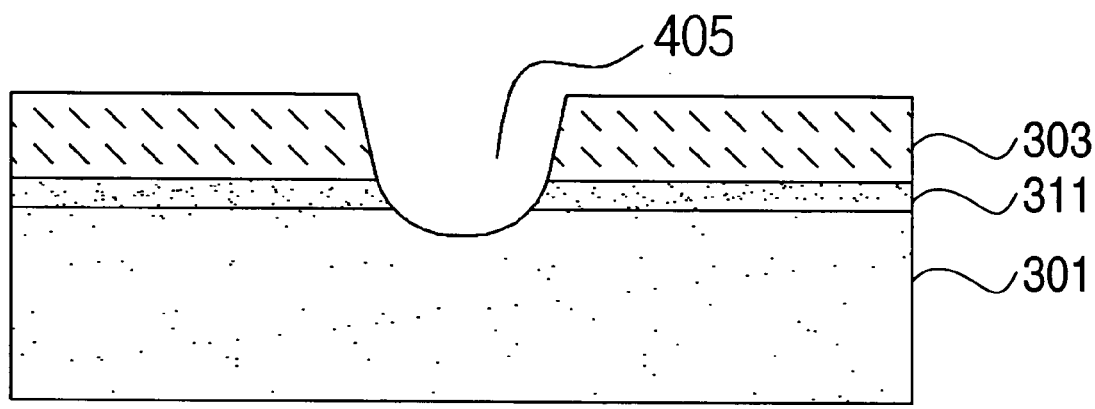

As illustrated in FIG. 3d, alternatively, a dry etching using an angle-etching and a chemical dry etching may be performed to form a trench 405 with the lower edges thereof having a rounded shape. More specifically, the first insulating layer 304 and the substrate 301 are etched by a dry etching using an angle etching, and the photoresist pattern 304 is removed. A chemical dry etching using $CF_4/O_2$ or $CHF_3/O_2$ is performed. Therefore, materials may be later deposited in the trench 405 with great uniformity.

Figure 3E:
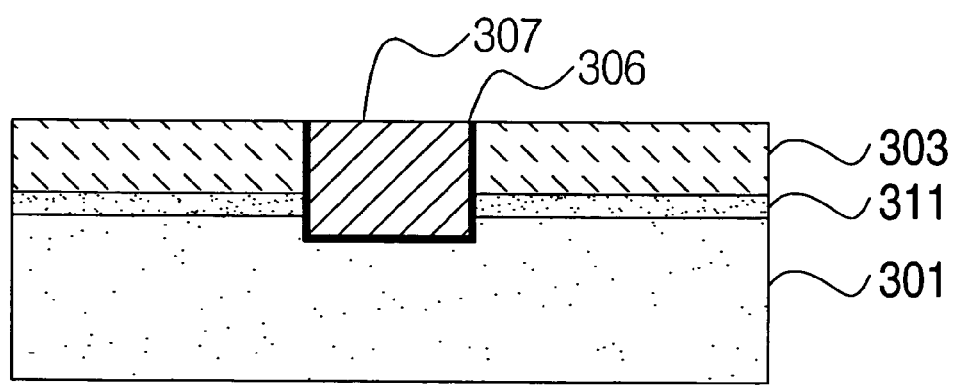

Referring to FIG. 3e, a trench gate is formed by depositing and planarizing a second insulating layer 306 and a conductor 307. In one aspect, the second insulating layer 306 is formed as a gate insulating layer on the substrate in which the trench is already formed. The conductor 307 is formed as the gate electrode on the second insulating layer 306. Next, the conductor 307 and the second insulating layer 306 are planarized by CMP, wherein the first insulating layer 303 is used as an etch-stop layer for the CMP. In one aspect, the conductor 307 comprises one selected from the group consisting of polysilicon, tungsten alloy, titanium alloy, and tantalum alloy. In another aspect, the second insulating layer 306 comprises one selected from the group consisting of tantalum oxides, titanium oxides, and hafnium oxides.

Figure 3F:
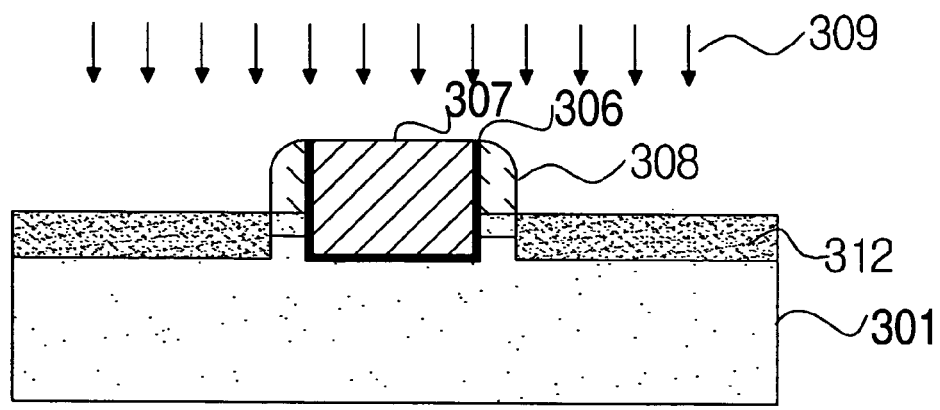

Referring to FIG. 3f, the first insulating layer is partially removed by an anisotropic etching, leaving a portion thereof on the sidewalls of the second insulating layer 306, thus forming spacers 308. Source/drain regions 312 are formed by ion implanting impurities of low concentration using the gate (i.e., the conductor 307 and the gate insulating layer 306) and the spacers 308 as a mask. In one aspect, the energy of the ion implantation for forming the source/drain regions is between 10 keV and 100 keV.

If damage to the gate due to the etching for forming the spacers is serious, the spacers 308 can be formed by removing the whole of the first insulating layer by etching, then forming and etching another insulating layer for spacers. In one aspect, the insulating layer for spacers comprises a nitride layer or an oxide layer.

Figure 3G:
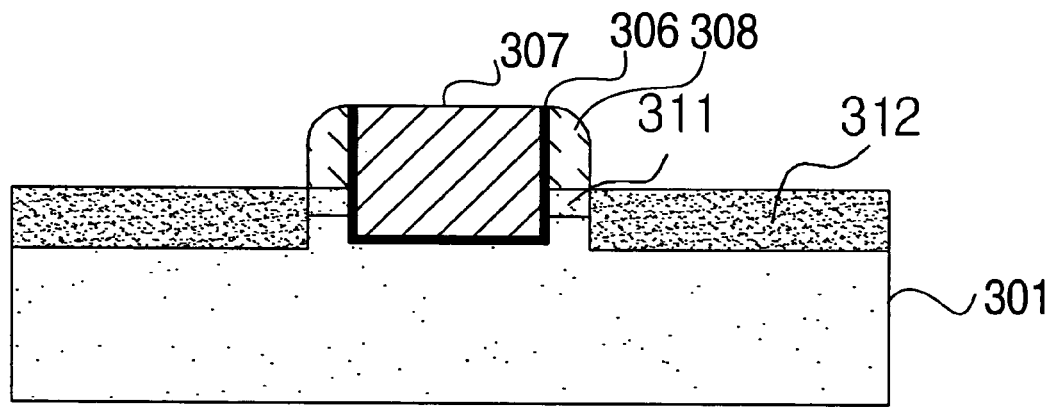

Referring to FIG. 3g, the LDD region 311 and the source/drain regions 312 are formed by diffusion during a thermal process, and therefore the channel length may be well controlled. The LDD region 311 is formed above the gate.

FIGS. 4a through 4g illustrate a manufacturing method of a transistor according to a third embodiment of the present invention.

Figure 4A:
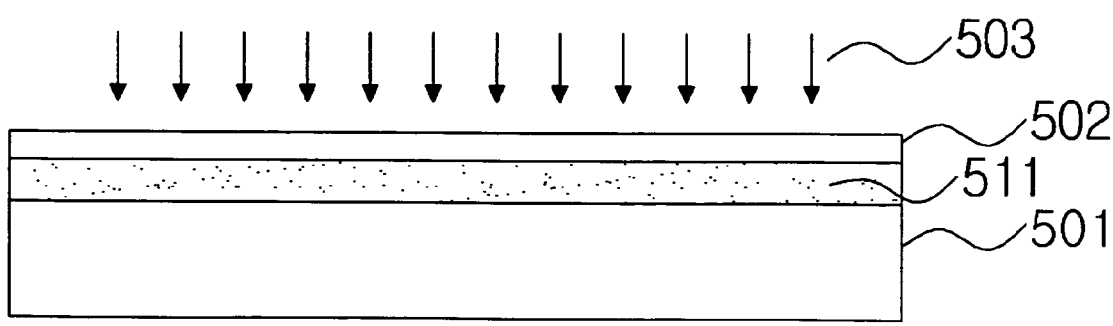
FIGS. 4a through 4g illustrate a cross-sectional view of a method for fabricating a transistor according to still another embodiment of the present invention.

First, referring to FIG. 4a, a first insulating layer 502 is deposited on a silicon substrate 501 and an LDD region 511 is formed using ion implantation 503. The first insulating layer 502 works as a buffer layer for the ion implantation and may comprise a nitride layer deposited to a thickness between 500 Å and 1500 Å. In one aspect, the energy of the ion implantation for forming the LDD region 511 preferably is between 5 keV and 60 keV.

Figure 4B:
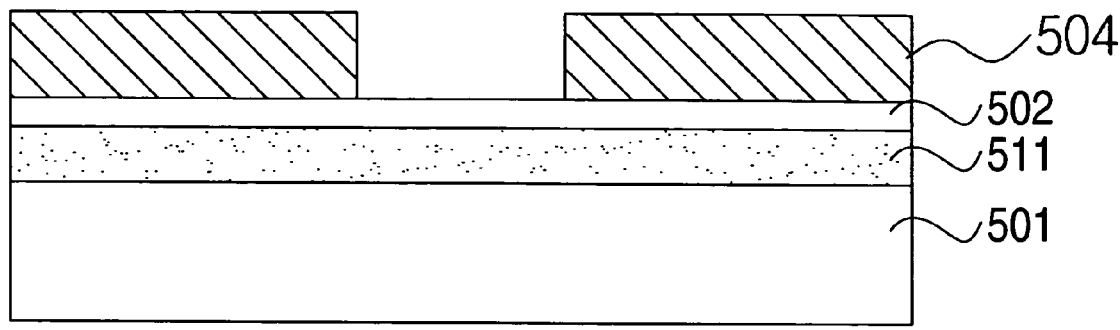

Referring to FIG. 4b, a first photoresist pattern 504 is formed on the first insulating layer 502 and then patterned to expose an area for the gate of the transistor with development and lithography processes.

Figure 4C:
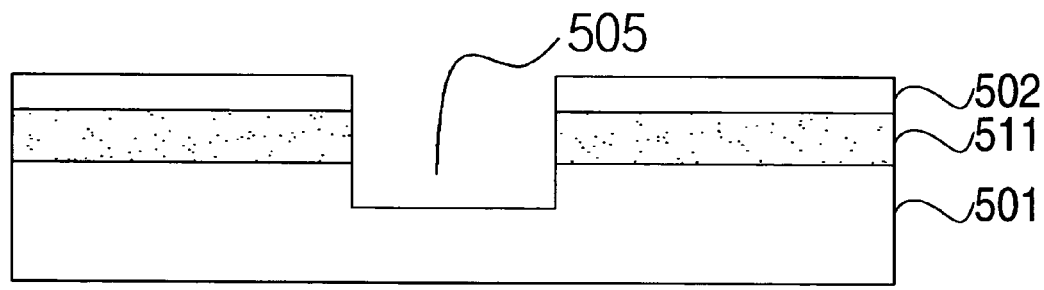

Referring to FIG. 4c, a trench 505 is formed by etching the first insulating layer and the substrate using the first photoresist pattern 504 as a mask. Then, the first photoresist pattern 504 is removed. In one aspect, the trench length is between 100 Å and 1000 Å. The etching method for forming the trench 505 may be a dry etching with an etching angle between 5° to 30°.

Figure 4D:
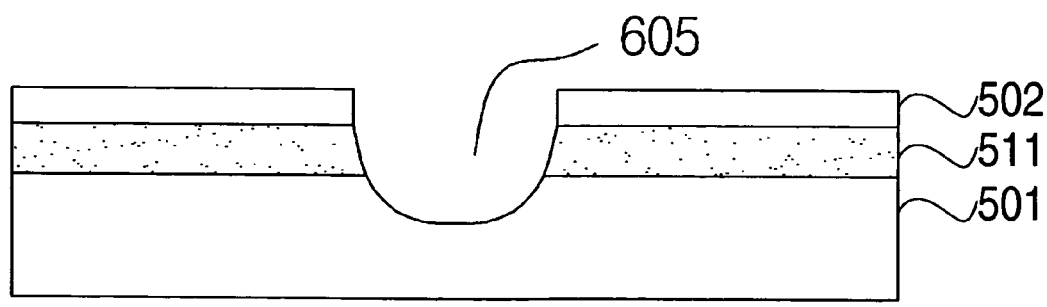

As illustrated in FIG. 4d, alternatively, an etchback using CDE (Chemical Dry Etching) may be performed to form a trench 605 with the lower edges thereof having a rounded shape. Therefore, materials may be later deposited in the trench 605 with great uniformity.

Figure 4E:
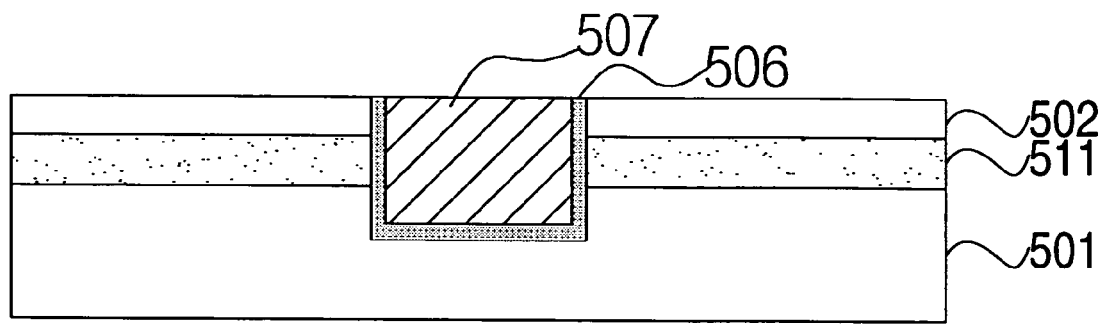

Referring to FIG. 4e, a second insulating layer 506 is formed on the substrate 501 in which the trench is already formed. A conductor 507 as a gate is formed on the second insulating layer. Next, the conductor 507 and the second insulating layer 506 are planarized by a CMP (Chemical Mechanical Polishing), wherein the first insulating layer 502 is used as an etch-stop layer for the CMP. In one aspect, the first conductor 507 is made of polysilicon. In another aspect, the second insulating layer 506 may be formed of silicon dioxide using a conventional thermal oxide method or chemical vapor deposition. In yet another aspect, the second insulating layer 506 may comprise a multi-layer of oxide material. In one aspect, the thickness of the second insulating layer 506 is between 15 Å and 80 Å.

Figure 4F:
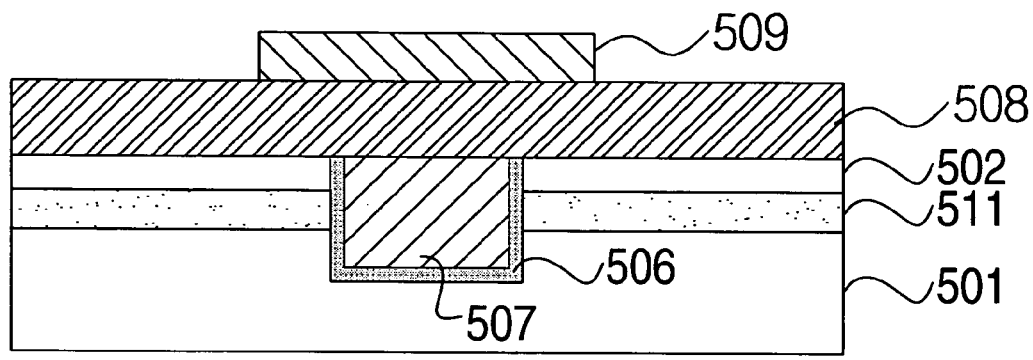

Referring to FIG. 4f, a second conductor 508 is deposited on the substrate after the planarization process has been finished. A second photoresist is formed on the second conductor 508 and then patterned to form a photoresist pattern 509. In one aspect, the second conductor 508 is made of one selected from the group consisting of tungsten alloys, titanium alloys, and tantalum alloys.

Figure 4G:
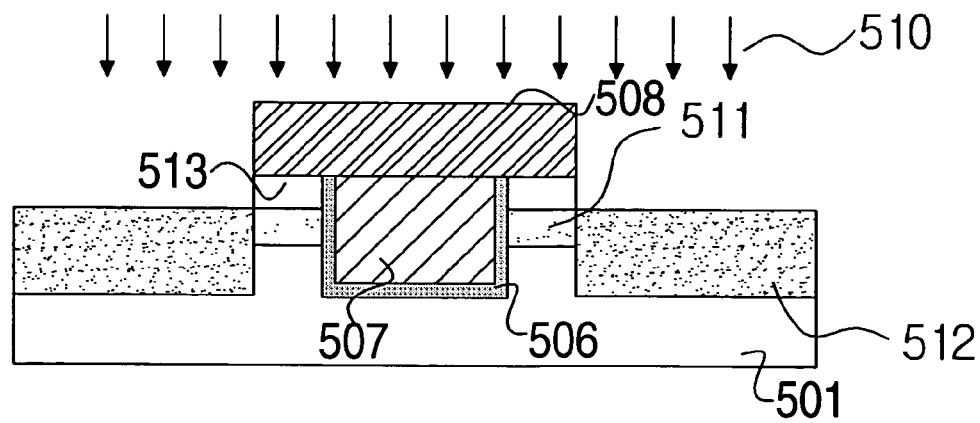

Referring to FIG. 4g, the second conductor 508 and the first insulating layer 502 are etched using the second photoresist pattern 509 as a mask. The second photoresist pattern 509 is then removed and the source/drain regions 512 are formed by an ion implantation process 510 using the etched second conductor 508 and first insulating layer 502 as a mask. In one aspect, the energy of the ion implantation for forming the source/drain regions 512 is between 30 keV and 80 keV. In another aspect, an oxide layer (not shown) may be formed as a buffer layer for the ion implantation to protect the substrate, and removed after the ion implantation. In one aspect, the first insulating layer 502 is only partially etched, thus forming a spacer 513. In another aspect, the first conductor comprises polysilicon and the second conductor comprises a metal, and therefore a contact to the gate formed during a later process may have a low resistance.

According to the present invention, the LDD region 511 and the source/drain regions 512 are formed by diffusion during a later thermal process, therefore the channel length of the transistor may be well controlled.

Thus, a method for fabricating a transistor of a semiconductor device according to the present invention can reduce the source/drain resistances and the gate resistance by forming a trench type gate and can efficiently control a short channel effect. It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating a semiconductor transistor, comprising:

forming a first insulating layer on a substrate;

performing an ion implantation for forming a lightly-doped drain (LDD) region in the substrate;

patterning the first insulating layer;

forming a trench in the substrate, the trench extending through the first insulating layer and the LDD region, and the trench extending into a portion of the substrate;

forming a trench gate having sidewalls by depositing and planarizing a second insulating layer and a conductor on the substrate with the trench formed therein, the trench gate comprising the second insulating layer and the conductor, wherein the trench gate is formed after forming the LDD region;

anisotropically etching the first insulating layer, except for a portion of the first insulating layer positioned on sidewalls of the trench gate, to form spacers; and forming source/drain regions by performing an ion implantation on the substrate using the spacers and the trench gate as a mask, wherein the source/drain regions are formed after forming the LDD region.

2. The method of claim 1, further comprising performing a thermal process after forming the source/drain regions.

3. The method of claim 1, wherein the first insulating layer is an oxide layer or a nitride layer.

4. The method of claim 1, wherein the conductor comprises one selected from the group consisting of polysilicon, tungsten alloys, titanium alloys, and tantalum alloys.

5. The method of claim 1, wherein the energy of the ion implantation for forming the LDD region is between 10 keV and 80 keV.

6. The method of claim 1, wherein the energy of the ion implantation for forming the source/drain regions is between 10 keV and 100 keV.

7. The method of claim 1, wherein the trench is formed by dry etching.

8. The method of claim 1, wherein the trench is formed by a dry etching using an angle etching and chemical dry etching.

9. The method of claim 8, wherein lower edges of the trench are formed in a rounded shape.

10. The method of claim 8, wherein the chemical dry etching uses $CF_4/O_2$ or $CHF_3/O_2$.

11. The method of claim 1, wherein planarizing a second insulating layer and a conductor comprises a CMP process using the first insulating layer as an etch-stop layer.

* * * * *